(12) United States Patent   (10) Patent No.:   US 12,604,726 B2
   Cai et al.   (45) Date of Patent:       Apr. 14, 2026

(54) ELECTRONIC FUSE

(71) Applicant: GlobalFoundries Singapore Pte. Ltd.,
Singapore (SG)

(72) Inventors: Xinshu Cai, Singapore (SG); Shyue Seng Tan, Singapore (SG); Eng Huat Toh, Singapore (SG)

(73) Assignee: GlobalFoundries Singapore Pte. Ltd.,
Singapore (SG)

( * ) Notice: Subject to any disclaimer, the term of this patent is extended or adjusted under 35 U.S.C. 154(b) by 70 days.

(21) Appl. No.: 17/879,145

(22) Filed: Aug. 2, 2022

(65) Prior Publication Data

US 2024/0047347 A1    Feb. 8, 2024

(51) Int. Cl.
*H01L 23/525*    (2006.01)

(52) U.S. Cl.
CPC ................................. *H01L 23/5256* (2013.01)

(58) Field of Classification Search
CPC ......... H01L 23/62; H01L 23/525–5258; H01L 23/53209; H01L 2924/1453; H10B 20/20–25; G11C 17/14–165
See application file for complete search history.

(56) References Cited

U.S. PATENT DOCUMENTS

| | | | |
|---|---|---|---|
| 8,178,944 B2 * | 5/2012 | Xia ..................... | H01L 23/5256 |
| | | | 257/209 |
| 9,093,453 B2 | 7/2015 | Li et al. | |
| 9,443,801 B2 | 9/2016 | Ding et al. | |
| 2007/0222028 A1 | 9/2007 | Matsuoka et al. | |
| 2009/0021338 A1 * | 1/2009 | Kim ...................... | H10B 20/20 |
| | | | 337/227 |
| 2012/0164799 A1 * | 6/2012 | Kurz ................... | H01L 23/5256 |
| | | | 257/E21.602 |
| 2015/0097266 A1 * | 4/2015 | Li ........................ | H01L 23/5256 |
| | | | 257/529 |
| 2016/0056162 A1 * | 2/2016 | Yeh ........................ | H10D 30/60 |
| | | | 257/379 |

* cited by examiner

*Primary Examiner* — Khaja Ahmad
*Assistant Examiner* — Candice Chan
(74) *Attorney, Agent, or Firm* — Andrew M. Calderon; Calderon Safran & Wright P.C.

(57) ABSTRACT

The present disclosure relates to semiconductor structures and, more particularly, to e-fuse structures and methods of manufacture. The structure includes: a silicided fuse structure which includes a narrow portion and wider, end portions; dummy structures on opposing sides of the silicided fuse structure; and sidewall spacer material separating the dummy structures from the silicided fuse structure.

19 Claims, 7 Drawing Sheets

ELECTRONIC FUSE

BACKGROUND

The present disclosure relates to semiconductor structures and, more particularly, to e-fuse structures and methods of manufacture.

An e-fuse (electronic fuse) allows for the dynamic real-time reprogramming of semiconductor devices. For example, by utilizing a set of e-fuses, a chip manufacturer can allow for the circuits on a chip to change while it is in operation. However, an e-fuse resistance after programming can have a large variation due to factors such as process variations, etc. By way of example, silicide variation or critical dimensions of the e-fuse materials may cause insufficient programming. Also, an increase in programming current can enlarge the margin, but it will also increase the requirement for the programming circuit footprint.

SUMMARY

In an aspect of the disclosure, a structure comprises: a silicided fuse structure comprising a narrow portion and wider, end portions; structures on opposing sides of the silicided fuse structure; and sidewall spacer material separating the structures from the silicided fuse structure.

In an aspect of the disclosure, a structure comprises: structures comprising semiconductor material; sidewall spacers on the structures; a polysilicon material between the structures and contacting the sidewall spacers, the polysilicon material comprising a narrow portion and wider, end portions; and a silicide on the polysilicon material including on the narrow portion and the wider, end portions.

In an aspect of the disclosure, a method comprises: forming structures on an insulator material; forming sidewall spacers on the structures; forming a polysilicon material between the structures and contacting the sidewall spacers, the polysilicon material comprising a narrow portion and wider, end portions; forming a silicide on the polysilicon material including on the narrow portion and the side, end portions.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to e-fuse structures and methods of manufacture. More specifically, the present disclosure relates to self-aligned polysilicon e-fuse structures and methods of manufacture. Advantageously, the e-fuse structures described herein exhibit narrow polysilicon critical dimensions (CD) and thinner polysilicon to obtain high resistance and improved process and programmability uniformity (e.g., lower process variations).

In embodiments, the e-fuse structures comprise a silicided polysilicon bounded by sidewall spacers, e.g., oxide or other dielectric material, on at least two sides. The silicided polysilicon may be spaced from dummy polysilicon material (e.g., dummy poly gates) by the sidewall spacers, where the silicided polysilicon includes a mid-portion having a smaller width than end portions of the silicided polysilicon. The silicided polysilicon may be connected to two separate terminals on the wider, end portions with different voltages. The dimensions of the silicided polysilicon may be controlled by adjusting either the spacing between two dummy poly gates or the thickness of the sidewall spacer material, as an example.

The e-fuse of the present disclosure can be manufactured in a number of ways using a number of different tools. In general, though, the methodologies and tools are used to form structures with dimensions in the micrometer and nanometer scale. The methodologies, i.e., technologies, employed to manufacture the e-fuse of the present disclosure have been adopted from integrated circuit (IC) technology. For example, the structures are built on wafers and are realized in films of material patterned by photolithographic processes on the top of a wafer. In particular, the fabrication of the e-fuse uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
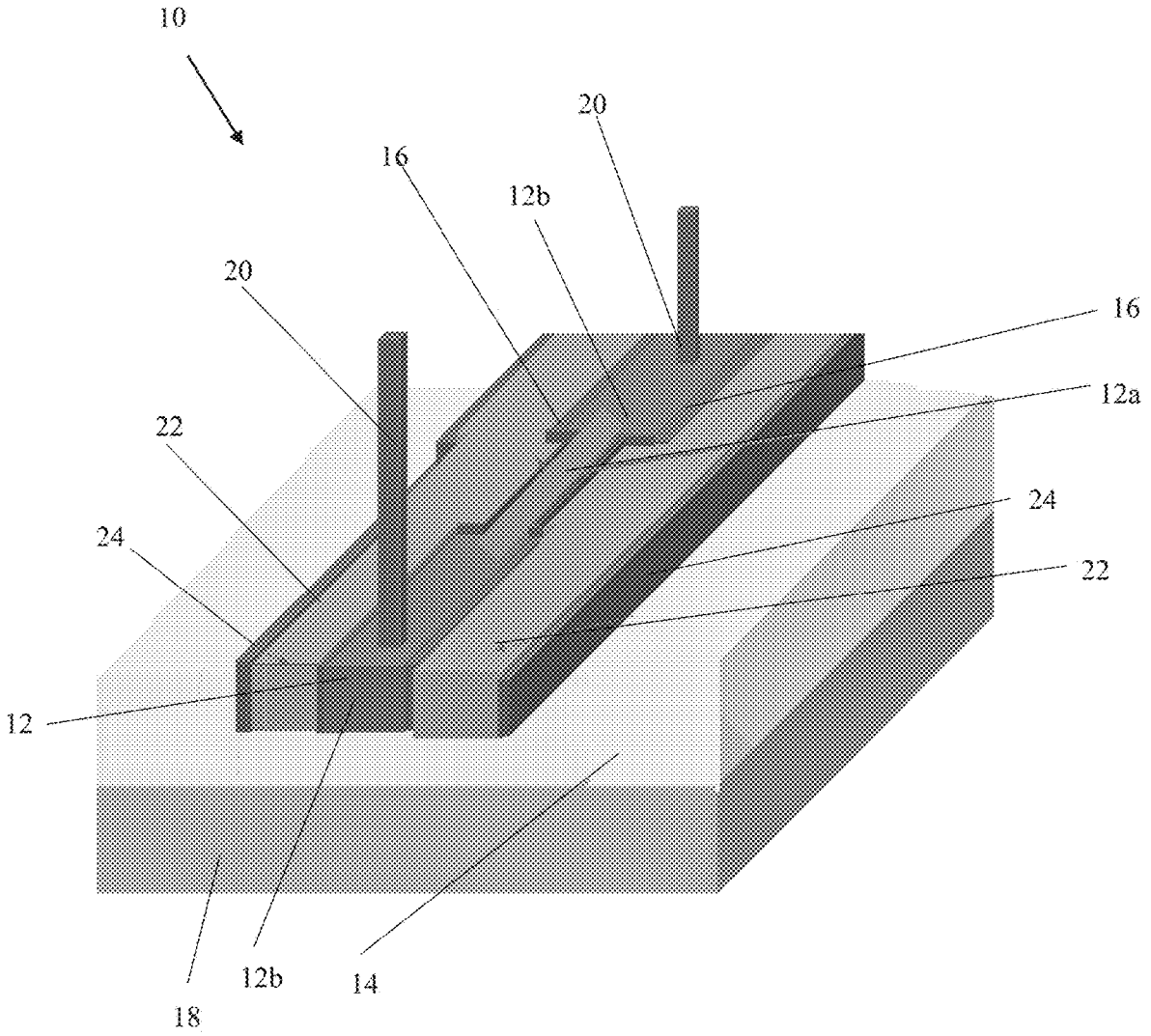
FIG. 1 shows an e-fuse structure in accordance with aspects of the present disclosure.

FIG. 1 shows an e-fuse structure in accordance with aspects of the present disclosure. In particular, the structure 10 shown in FIG. 1 includes an e-fuse structure 12 on an insulator material 14. In embodiments, the e-fuse structure 12 may be a silicided polysilicon material and the insulator material 14 may be a shallow trench isolation structure comprising $SiO_2$. In more specific embodiments, the e-fuse structure 12 comprises monolithic polysilicon material, which has a silicide completely covering its upper surface as described in more detail with respect to FIG. 4C, for example. Also, as described in more detail herein, the e-fuse structure 12 is a self-aligned structure between sidewall spacers 16 located on each sidewall. The insulator material 14 may be provided on a semiconductor substrate 18. In embodiments, the semiconductor substrate 18 may be any semiconductor material, e.g., Si, SiGe, SiGeC, SiC, GaAs, InAs, InP, and other III/V or II/VI compound semiconductors.

Still referring to FIG. 1, the e-fuse structure 12 comprises a narrow portion 12a and wider, end portions 12b. In embodiments, the narrow portion 12a may be about 20 nm in width; although other dimensions are also contemplated herein. The wider, end portions 12b may be electrically connected to contacts 20. The contacts 20 may provide different voltages to the e-fuse structure 12. Dummy structures 22 (e.g., dummy gate structures) may be provided on both sides of the e-fuse structure 12, separated therefrom by the sidewall spacers 16. In embodiments, the dummy structures 22 may be polysilicon material, which does not have an electrical function. The dummy structures 22 provide self-alignment to the e-fuse structure 12. Sidewall spacers 24 may also be provided on the outer sidewalls of the dummy structures 22.

Figure 2:
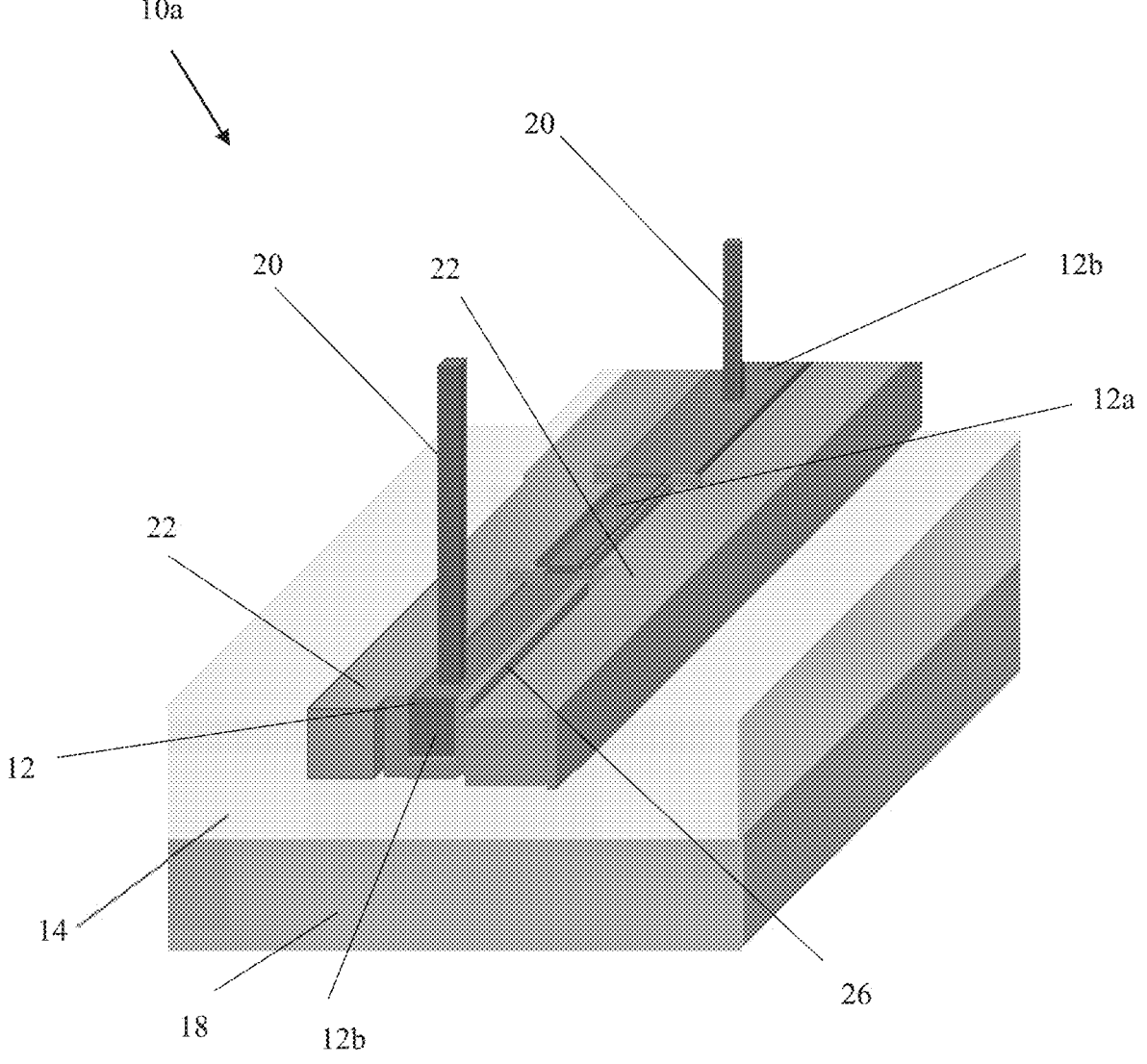
FIG. 2 shows an e-fuse structure in accordance with additional aspects of the present disclosure.

FIG. 2 shows an e-fuse structure in accordance with additional aspects of the present disclosure. In particular, the structure 10a shown in FIG. 2 includes an e-fuse structure 12 on an insulator material 14. Similar to the previous embodiment, the e-fuse structure 12 may be a silicided polysilicon material and the insulator material 14 may be a shallow trench isolation structure comprising $SiO_2$. Also, as described herein, the e-fuse structure 12 may be a self-aligned structure between and above spacer material 26, e.g., oxide. In embodiments, the spacer material 26 is provided on the shallow trench isolation structure 14, below the e-fuse structure 12, and on both sidewalls of the e-fuse structure 12. Accordingly, in this embodiment, the e-fuse structure 12 is wrapped by the spacer material 26 on both sides and the bottom. The spacer material 26 may also be on a top surface of the dummy structures 22.

Still referring to FIG. 2, the e-fuse structure 12 also comprises the narrow portion 12a and wider, end portions 12b. In embodiments, the narrow portion 12a may be about 20 nm in width; although other dimensions are also contemplated herein. The wider, end portions 12b may be electrically connected to contacts 20. The contacts 20 may provide different voltages to the e-fuse structure 12.

The dummy structures 22 may be provided on both sides of the e-fuse structure 12, separated therefrom by the spacer material 26. The spacer material 26 may also be blanket deposited on the dummy structures 22. In this embodiment, the dummy structures 22, which may also be polysilicon material, are devoid of sidewall spacers on the outer sidewalls. The thickness of the e-fuse structure 12 can be controlled by the thickness of the spacer material 26, as the e-fuse structure 12 can be formed by a chemical mechanical polish (CMP) process after deposition of the spacer material 26 above the patterned dummy structures 22.

Figure 3:
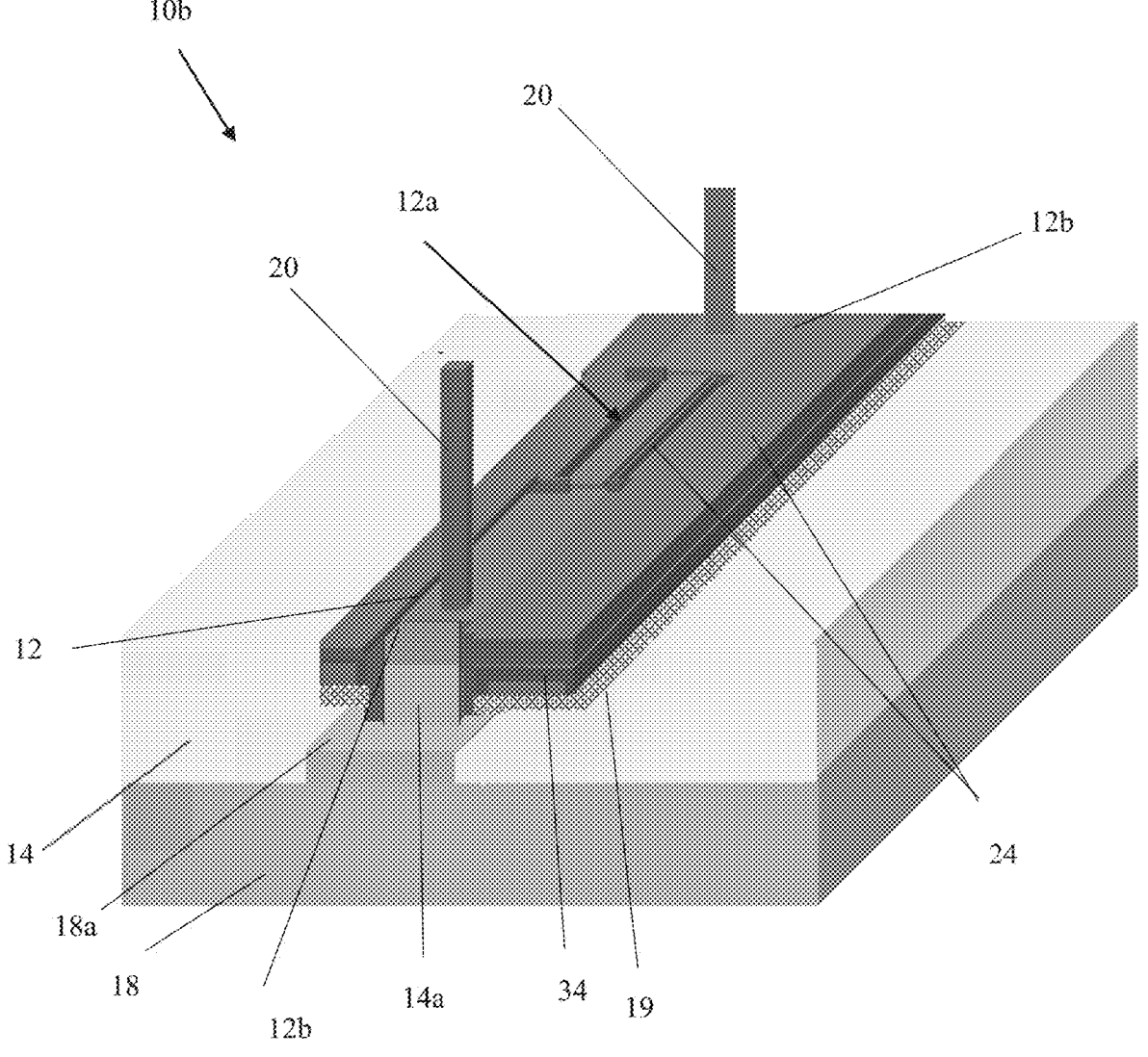
FIG. 3 shows an e-fuse structure which utilizes materials and processes of a memory device in accordance with additional aspects of the present disclosure.

FIG. 3 shows an e-fuse structure which utilizes the materials and processes of a memory device in accordance with additional aspects of the present disclosure. In particular, the structure 10b shown in FIG. 3 includes an e-fuse structure 12 on either the insulator material 14a or the semiconductor substrate 18. In embodiments, the insulator material 14a may comprise LOCOS (local oxidation of silicon). For example, the LOCOS may be $SiO_2$ formed in selected areas on the semiconductor substrate 18. The semiconductor substrate 18a under the insulator material 14a may be doped with an N+ type implant.

The e-fuse structure 12 comprises a silicided polysilicon material which includes a narrow, middle portion 12a and wider, end portions 12b. Also, in this embodiment, the e-fuse structure 12 may be an erase gate in an existing memory device. The wider, end portions 12b may be electrically connected to contacts 20 which provide different voltages to the e-fuse structure 12 and, unlike a memory device, the contacts 20 are not electrically connected together.

A control gate 34 may be provided on both sides of the e-fuse structure 12, separated therefrom by the spacer material 24. Accordingly, the e-fuse structure 12 is a self-aligned structure between and above spacer material 24, e.g., oxide. In this embodiment, the control gate 34 may also be polysilicon material. The spacer material 24 may be provided on a top surface of the control gate 34. The control gate 34 may be provided on either or both the insulator material 14 (e.g., shallow trench isolation structure) and the semiconductor substrate 18. A floating gate polysilicon material together with an ONO ($SiO_2$/SiN/$SiO_2$) layer 19 may also be under the control gate 34.

Figure 4A:
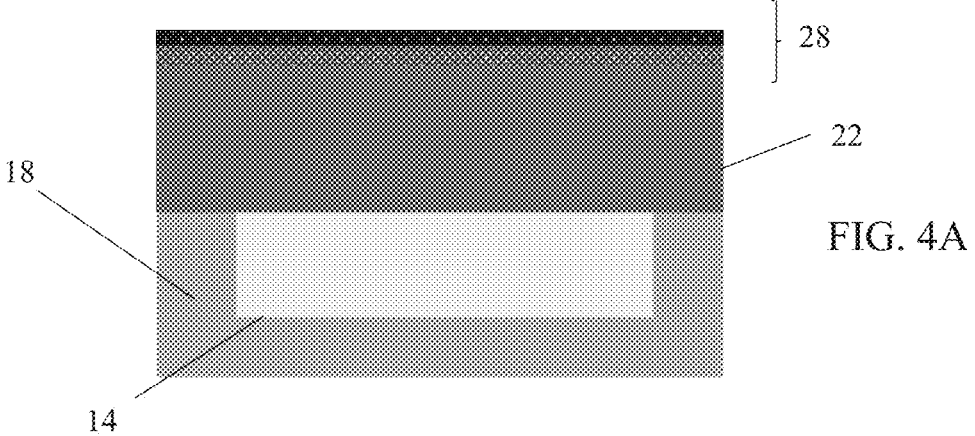
FIGS. 4A-4D show processing steps for fabricating the e-fuse structure of FIG. 1.

FIGS. 4A-4D show processing steps for fabricating the e-fuse structure 10 of FIG. 1. More specifically, FIG. 4A shows shallow trench isolation structures 14 formed in the semiconductor substrate 18. The shallow trench isolation structures 14 can be formed by conventional lithography, etching and deposition methods known to those of skill in the art. For example, a resist formed over the semiconductor substrate 18 is exposed to energy (light) and developed to form a pattern (opening). An etching process with a selective chemistry, e.g., reactive ion etching (RIE), will be used to transfer the pattern from the resist to the semiconductor substrate 18 to form one or more trenches in the semiconductor substrate 18. Following the resist removal by a conventional oxygen ashing process or other known stripants, insulator material can be deposited by any conventional deposition processes, e.g., chemical vapor deposition (CVD) processes. Any residual material on the surface of the semiconductor substrate 18 can be removed by conventional CMP processes.

Still referring to FIG. 4A, polysilicon material 22 may be blanket deposited on the semiconductor substrate 18 and the shallow trench isolation structures 14. The polysilicon material 22 may be deposited by a conventional CVD process. A hardmask 28 may be deposited on the polysilicon material 22. In embodiments, the hardmask 28 may comprise oxide and SiN, as examples. The hardmask 28 may also be deposited by a CVD process.

Figure 4B:
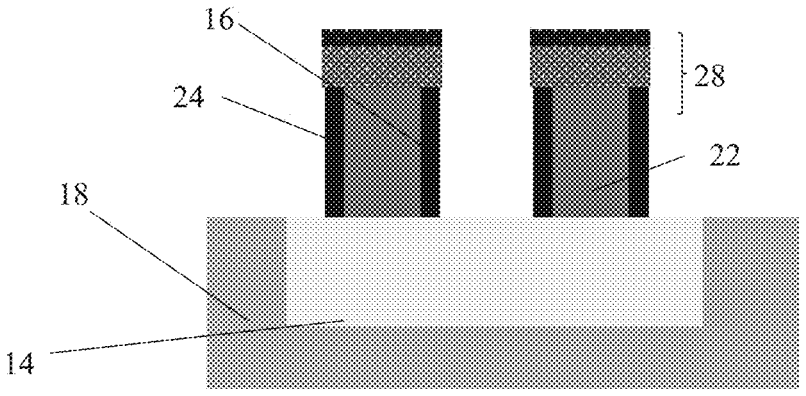

As further shown in FIG. 4B, the polysilicon material 22 is patterned to form the dummy structures 22 as shown in FIG. 1. The patterning process may be conventional lithography and etching processes as already described herein such that no further explanation is required. As should be understood by those of skill in the art, the lithography and etching processes will result in an inverse pattern of the e-fuse in order to form the narrow and wide portions of the e-fuse.

The sidewall spacers 16, 24 may be formed on the patterned dummy structures 22. The sidewall spacers 16, 24 may be a nitride or oxide material formed by a blanket deposition process, followed by a conventional epitaxial process.

Figure 4C:
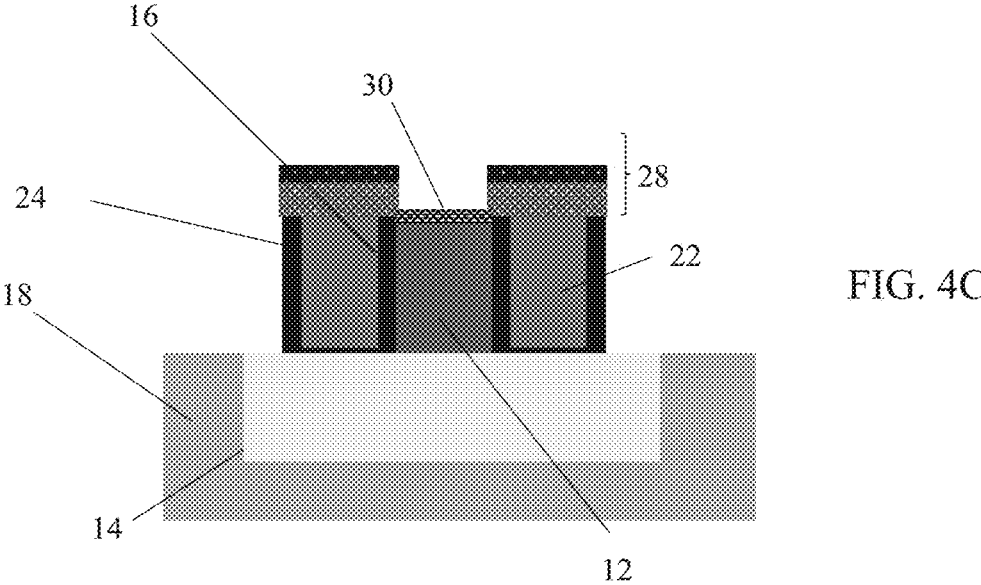

In FIG. 4C, the e-fuse material, e.g., polysilicon, may be deposited between the sidewall spacers 16 of the dummy structures 22. In this way, the e-fuse structure 12 is self-aligned between and the sidewall spacers 16. In embodiments, any excess polysilicon material may be removed from the top surface of the patterned dummy structures 22, e.g., surface of the hardmask 26, by a conventional chemical mechanical polish (CMP) process.

A silicide contact 30 may be formed on the upper surface of the polysilicon material of the e-fuse 12, e.g., completely covering both the narrow portion and the wider, end portions. As should be understood by those of skill in the art, the silicide process begins with deposition of a thin transition metal layer, e.g., nickel, cobalt or titanium, over fully formed and patterned semiconductor devices (e.g., polysilicon material of the e-fuse). After deposition of the material, the structure is annealed allowing the transition metal to react with exposed polysilicon (or other semiconductor material as described herein) forming a low-resistance transition metal silicide. Following the reaction, any remaining transition metal is removed by chemical etching, leaving silicide contact 30.

Figure 4D:
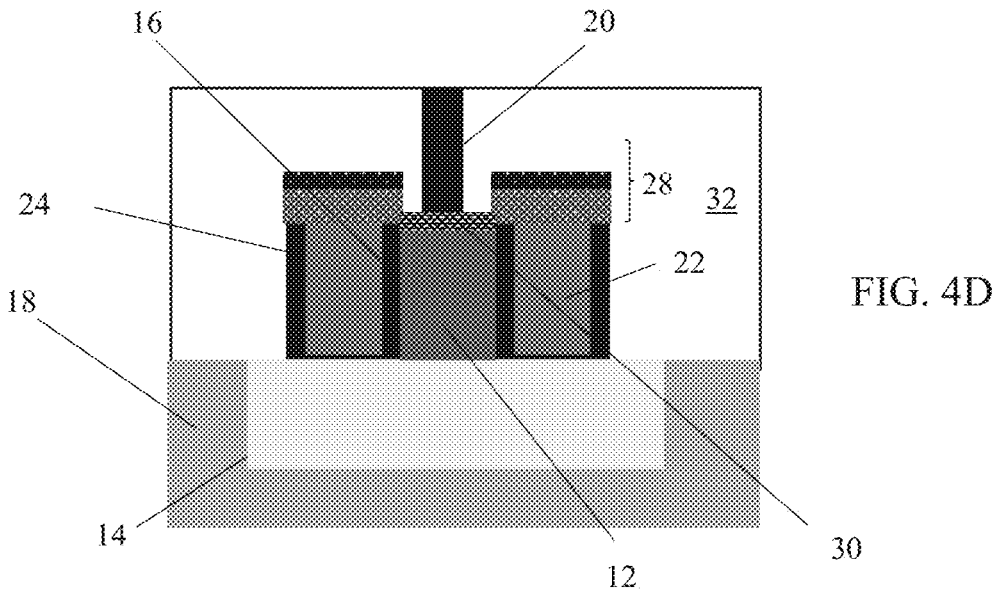

As further shown in FIG. 4D, contacts 20 may be formed on the silicide contact 30 on the e-fuse 12, e.g., wide, end portions 12*b* of the e-fuse 12. As should be understood by those of skill in the art, the contacts 20 may be tungsten; although other conductive material and barrier liners, e.g., TaN or TiN, are contemplated herein. The contacts 20 may be formed in a trench within an interlevel dielectric material 32, using conventional deposition, lithography, etching and planarization (e.g., CMP) processes as already described herein.

Figure 5A:
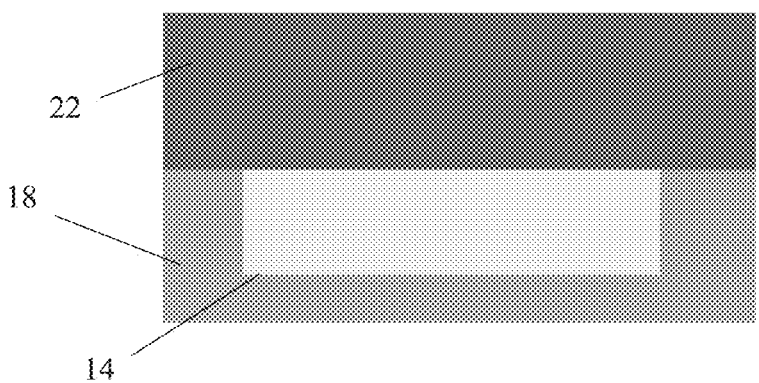
FIGS. 5A-5E show processing steps for fabricating the e-fuse structure of FIG. 2.

FIGS. 5A-5E show processing steps for fabricating the e-fuse structure 10*a* of FIG. 2. More specifically, FIG. 5A shows a shallow trench isolation structures 14 formed in the semiconductor substrate 18. The shallow trench isolation structures 14 can be formed by conventional lithography, etching and deposition methods known to those of skill in the art and as described with respect to FIG. 4A. A polysilicon material 22 may be blanket deposited on the semiconductor substrate 18 and the shallow trench isolation structures 14.

Figure 5B:
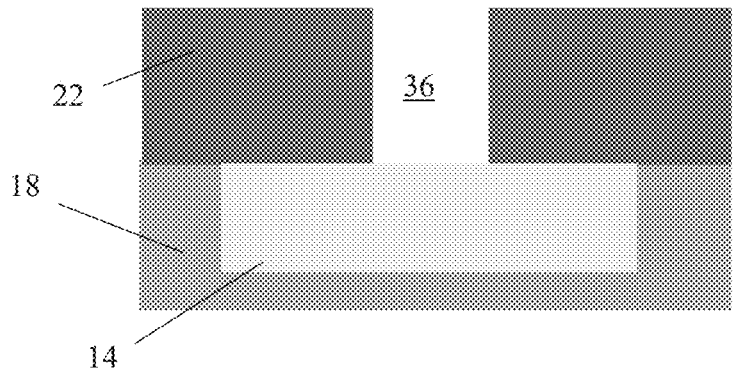

As further shown in FIG. 5B, the polysilicon material 22 may be patterned to form a trench 36 over the shallow trench isolation structures 14. The patterning process may be conventional lithography and etching processes as already described herein such that no further explanation is required. As also should be understood by those of skill in the art, the lithography and etching processes will result in an inverse pattern of the e-fuse in order to form the narrow and wide portions of the e-fuse.

Figure 5C:
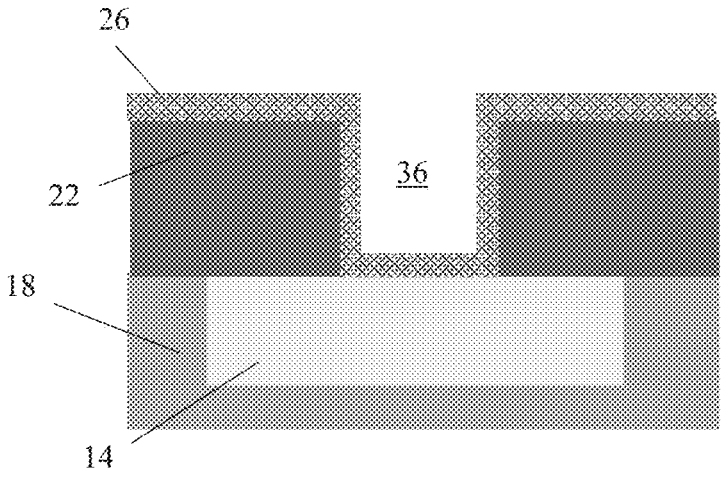

In FIG. 5C, a spacer material 26 may be formed on the polysilicon material 22 and within the trench 36. In this way, the spacer material 26 will line the sidewalls and bottom of the trench 36, and a top surface of the polysilicon material 22 (e.g., patterned dummy structures 22). The spacer material 26 may be an oxide material formed by a thermal oxidation process, as an example.

Figure 5D:
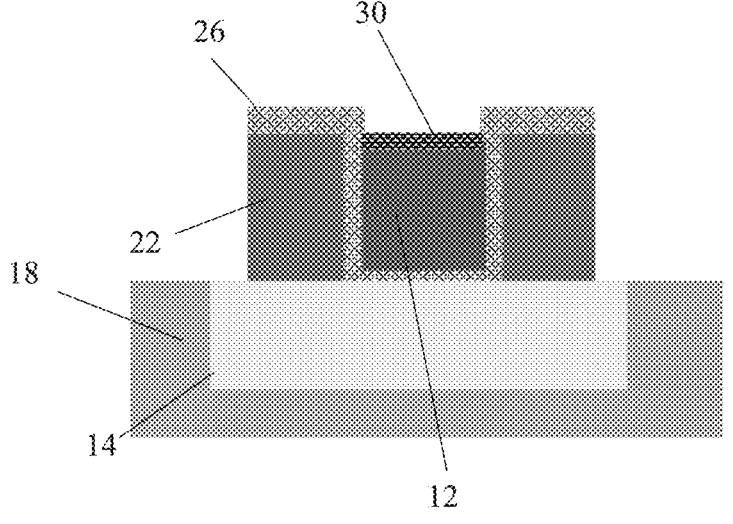

In FIG. 5D, the e-fuse material 12, e.g., polysilicon, may be deposited between and above the sidewall spacers 26 within the trench 36. In embodiments, any excess polysilicon material may be removed from the top surface of the patterned dummy structures 22 by a conventional chemical mechanical polish (CMP) process. In this way, the e-fuse structure 12 is self-aligned between the sidewall spacers 26 and dummy structures 22. As already described, silicide contact 30 may be formed on the polysilicon material of the e-fuse structure 12. The thickness of e-fuse structure 12 can be adjusted by the thickness of layer 26.

Figure 5E:
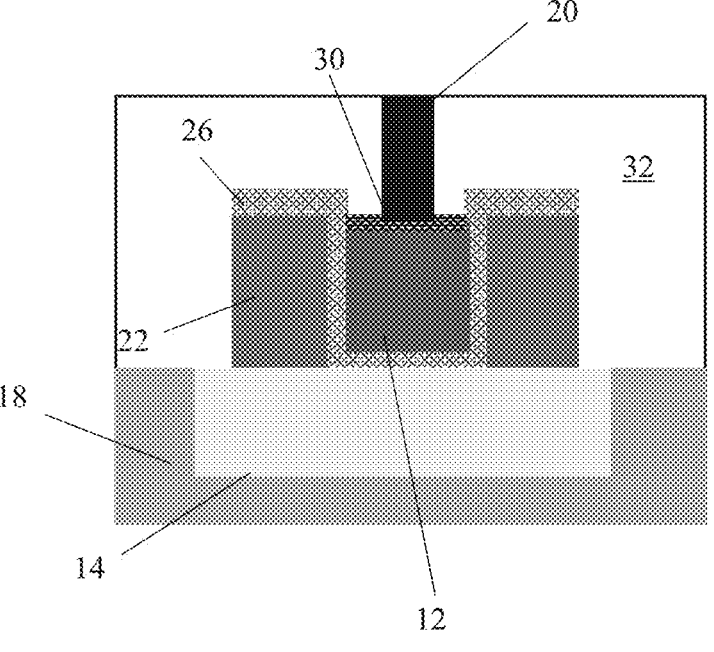

As further shown in FIG. 5E, contacts 20 may be formed on the suicide contact 30 on the e-fuse 12, e.g., wide, end portions 12*b* of the e-fuse. As should be understood by those of skill in the art, the contacts 20 may be tungsten; although other conductive material and barrier liners, e.g., TaN or TiN, are contemplated herein. The contacts 20 may be formed in a trench within an interlevel dielectric material 32, using conventional deposition, lithography, etching and planarization (e.g., CMP) processes as already described herein.

The e-fuse can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a silicided fuse structure on an insulator material, the silicided fuse structure comprising, in a horizontal orientation with respect to an upper surface of an underlying insulator material, a width with a narrow middle portion and a width with wider, end portions;
   polysilicon structures on opposing sides of the silicided fuse structure; and
   sidewall spacer material separating the polysilicon structures from the silicided fuse structure; and
   sidewall spacers on outer sidewalls of the polysilicon structures,
   wherein the polysilicon structures have a wider portion corresponding to the narrow middle portion of the silicided fuse structure and a narrower portion corresponding to the wider, end portions, in a horizontal orientation.

2. The structure of claim 1, wherein the silicided fuse structure comprises polysilicon material bounded on both sides by the sidewall spacer material, and the polysilicon structures are along a length of the silicided fuse structure and do not have an electrical function.

3. The structure of claim 2, wherein the sidewall spacer material comprises oxide material.

4. The structure of claim 1, wherein the sidewall spacers and the sidewall spacer material comprise a same material.

5. The structure of claim 1, further comprising insulator material on a top surface of the polysilicon structures.

6. The structure of claim 1, wherein the silicided fuse structure is on a shallow trench isolation structure.

7. The structure of claim 1, further comprising contacts on the wider, end portions.

8. The structure of claim 1, wherein the silicided fuse structure is provided on an oxidation of semiconductor material.

9. The structure of claim 8, wherein the semiconductor material comprises an n-type implant.

10. The structure of claim 1, wherein silicide completely covers a top surface of the silicided fuse structure and the sidewall spacer material lines a sidewall of the narrow middle portion, the wider, end portions and a junction between the narrow middle portion and the wider, end portions.

11. The structure of claim 1, wherein the silicided fuse structure comprises monolithic polysilicon material, which has a silicide completely covering its upper surface and the polysilicon material comprises dummy gate structures.

12. A structure comprising:
dummy gate structures comprising semiconductor material;
sidewall spacers on the dummy gate structures;
a polysilicon material between the dummy gate structures and contacting the sidewall spacers, the polysilicon material comprising, in a horizontal orientation, a narrow middle portion and wider, end portions; and
a silicide on the polysilicon material including on the narrow portion and the wider, end portions,
wherein the dummy gate structures comprise, in the horizontal orientation, a wider middle portion corresponding to the narrow middle portion of the polysilicon material and narrow end portions corresponding to the wider end portions of the polysilicon material.

13. The structure of claim 12, wherein the sidewall spacers comprise oxide material.

14. The structure of claim 13, further comprising sidewall spacers on outer sidewalls of the dummy gate structures.

15. The structure of claim 12, wherein the dummy gate structures comprise polysilicon material.

16. The structure of claim 12, wherein the polysilicon material is on a shallow trench isolation structure.

17. The structure of claim 12, wherein the polysilicon material is provided on an oxidation of semiconductor material.

18. The structure of claim 17, wherein the semiconductor material comprises an n-type implant.

19. The structure of claim 12, wherein the semiconductor material of the dummy gate structures comprises polysilicon material, the polysilicon material comprises a fuse structure of monolithic polysilicon material, and the silicide completely covers an upper surface of the fuse structure.

* * * * *